(12) United States Patent
Maruo et al.

(10) Patent No.: US 7,473,962 B2
(45) Date of Patent: Jan. 6, 2009

(54) SEMICONDUCTOR DEVICE HAVING NONVOLATILE MEMORY DEVICE WITH IMPROVED CHARGE HOLDING PROPERTY

(75) Inventors: Yutaka Maruo, Sakata (JP); Susumu Inoue, Atsugi (JP); Yo Takeda, Shonai (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/330,870

(22) Filed: Jan. 12, 2006

(65) Prior Publication Data

US 2006/0170030 A1    Aug. 3, 2006

(30) Foreign Application Priority Data

Feb. 3, 2005    (JP) .............................. 2005-027962

(51) Int. Cl.
  *H01L 29/94*   (2006.01)
(52) U.S. Cl. ...................... 257/324; 257/315
(58) Field of Classification Search ................ 257/294, 257/316, 365; 438/128, 216, 257, 267
  See application file for complete search history.

(56) References Cited

U.S. PATENT DOCUMENTS

| | | | |
|---|---|---|---|
| 6,413,821 B1 * | 7/2002 | Ebina et al. ................. | 438/257 |
| 6,518,124 B1 * | 2/2003 | Ebina et al. ................. | 438/257 |
| 6,627,491 B2 * | 9/2003 | Ebina et al. ................. | 438/216 |
| 6,709,922 B2 * | 3/2004 | Ebina et al. ................. | 438/257 |
| 6,737,322 B2 * | 5/2004 | Inoue et al. ................. | 438/267 |
| 6,809,385 B2 * | 10/2004 | Ebina et al. ................. | 257/365 |
| 6,815,283 B2 * | 11/2004 | Lee ............................. | 438/211 |
| 6,828,622 B2 * | 12/2004 | Kitamura et al. ............ | 257/316 |
| 7,005,328 B2 * | 2/2006 | Ebina et al. ................. | 438/128 |
| 7,126,175 B2 * | 10/2006 | Inoue et al. ................. | 257/294 |
| 2002/0158280 A1 * | 10/2002 | Shinkawata ................. | 257/296 |

FOREIGN PATENT DOCUMENTS

JP    08-181204    7/1996

* cited by examiner

*Primary Examiner*—David Vu
*Assistant Examiner*—Andres Lopez Esquerra
(74) *Attorney, Agent, or Firm*—Harness, Dickey & Pierce, P.L.C.

(57) ABSTRACT

A semiconductor device includes: a semiconductor layer; a first area and a second area which are demarcated by a separation insulating layer provided on the semiconductor layer; a nonvolatile memory provided on the first area; a plurality of MOS transistors provided on the second area; a first interlayer insulating layer embedded between the plurality of MOS transistors on the second area; and a second interlayer insulating layer provided above the first area and the second area. The second interlayer insulating layer is provided as if covering the nonvolatile memory on the first area and, on the second area, provided, being above the first interlayer insulating layer, as if covering the MOS transistor.

10 Claims, 7 Drawing Sheets

(A)

(B)

(C)

(A)

(B)

SEMICONDUCTOR DEVICE HAVING NONVOLATILE MEMORY DEVICE WITH IMPROVED CHARGE HOLDING PROPERTY

BACKGROUND OF THE INVENTION

The entire disclosure of Japanese Patent Application No. 2005-027962, filed Feb. 3, 2005 is expressly incorporated by reference herein.

1. Technical Field

The invention relates to a semiconductor device.

2. Related Art

With recent trends for higher integration and microminiaturization of semiconductor devices, higher accuracy is being called for in alignment when forming a contact layer and the like connecting wiring to a semiconductor layer. Consequently, in JP-A-8-181204, there is disclosed a technique in which an etching stopper film is provided between an interlayer insulating layer and a semiconductor layer, whereby an element and a semiconductor layer will not suffer any damage even if excessive etching is carried out when forming a contact hole.

JPA-8-181204 is an example of related art.

However, when forming an etching stopper film on a nonvolatile memory having a floating gate electrode which is an example of a semiconductor element, depending on a material of the etching stopper film, deterioration of a charge holding property may occur. Hence, even in a microminiaturized semiconductor device, development of a semiconductor device in which excellent properties have been maintained is called for.

SUMMARY

An advantage of some aspects of the invention is to provide a semiconductor device, which is microminiaturized and has a nonvolatile memory with an excellent charge holding property.

According to a first aspect of the invention, a semiconductor device includes: a semiconductor layer; a first area and a second area which are demarcated by a separation insulating layer provided on the semiconductor layer; a nonvolatile memory provided on the first area; a plurality of MOS transistors provided on the second area; a first interlayer insulating layer embedded between the plurality of MOS transistors on the first area; and a second interlayer insulating layer provided above the first area and the second area, wherein the second interlayer insulating layer is provided as if covering the nonvolatile memory on the first area and, on the second area, provided, being above the first interlayer insulating layer, as if covering the MOS transistors.

According to the semiconductor device of the invention, the nonvolatile memory and the MOS transistors are provided on the same semiconductor layer, whereas the first interlayer insulating layer is provided between the MOS transistors occupying a small space. However, the first interlayer insulating layer is not provided above the nonvolatile memory.

While the insulating layer can be properly embedded in a small space spot, depending on its material, for example, it may affect the charge holding property of the nonvolatile memory by being set up on a nonvolatile memory having a floating gate electrode. Further, with regards to a semiconductor device having various semiconductor elements set up on the same semiconductor layer, depending on respective semiconductor elements, there is a different embedding property required.

In the semiconductor device of the invention, only where a high embedding property is required, a first interlayer insulating layer meeting the requirement is set up, and in other places, a second interlayer insulating layer of a material not inducing deterioration of its properties is set up. Consequently, it is possible to provide a semiconductor device designed to maintain its embedding property and its properties.

It should be noted that when referring to a specified layer B (hereinafter referred to as the "layer B") provided above a specified layer A (hereinafter referred to as the "layer A"), it refers to a case of the layer B being set up on the layer A and a case of the layer B being set up on the layer A by way of another layer.

The semiconductor device of the invention can further assume the following aspects.

A. In the semiconductor device of the invention, the first interlayer insulating layer of the second area may be provided between the gate electrodes of the MOS transistors.

B. In the semiconductor device of the invention, the first interlayer insulating layer may be an ozone TEOS film, and the second interlayer insulating layer may be a BPSG film.

According to these aspects, the Ozone TEOS (tetraethoxyorthosilicate) film is a film having a high embedding property, so that it can be properly embedded between the gate electrodes of adjacent MOS transistors. It should be noted that in the semiconductor device of the invention, the ozone TEOS film refers to a film formed by a hot CVD using a gaseous TEOS under a normal pressure atmosphere which includes ozone.

C. In the semiconductor device of the invention, further, an etching stopper film provided below the second interlayer insulating layer may be included.

According to this aspect, there is an advantage when forming a contact which connects a gate electrode of the MOS transistor and the nonvolatile memory to wiring. When forming the contact, a contact hole is set up by etching the second interlayer insulating layer. Excessive etching is prevented in this process, and causing a damage to the gate electrode and the like can be restrained. Especially, the more the semiconductor device is subjected to microminiaturization, the more problem due to excessive etching tends to occur. But, according to this embodiment, even in case of a microminiaturized semiconductor, excessive etching can be prevented.

D. In the semiconductor device of the invention, the nonvolatile memory includes a third area and a fourth area demarcated by an embedded insulating layer which is provided on the semiconductor layer; a control gate set up on the third area and constituted by an impurity layer; an insulating layer provided above the third area and the fourth area; a floating gate electrode provided above the insulating layer and constituted by a continuous layer above the third area and the fourth area; and a source area and a drain area provided on the semiconductor layer on a side of the floating gate electrode on the fourth area, wherein a clear area devoid of the etching stopper film can be set up above the floating gate.

According to this aspect, if the etching stopper film is, for example, a film having a charge supplementary property (for example, a nitride silicon film), then, there is an advantage. When the etching stopper film having the charge supplementary property is placed above the floating gate electrode, an electron which is written is lost, so that data may be lost.

However, according to the aspect, a clear area is provided on the floating gate electrode. Namely, no etching stopper film is set up there. Consequently, it is possible to provide a semiconductor device with an enhanced charge holding property.

E. In the semiconductor device of the invention, the clear area can be an entire upper surface of the floating gate electrode.

According to the aspect, it is possible to enhance the charge holding property even more.

F. In the semiconductor device of the invention, the clear area may have a large pattern by comparison to the upper surface of the floating gate electrode.

According to the aspect, even if there is a mask discrepancy when forming the clear area, it is possible to secure the clear area of a preset area on the floating gate electrode, thus enabling the charge holding property to improve even more.

G. In the semiconductor device of the invention, it is further possible to include the contact layer connected to the nonvolatile memory, while it is possible for the clear area and the area, in which the contact layer is formed, to be such as not to overlay each other According to the aspect, since the etching stopper film remains at a position in which the contact layer is formed, contact hole formation can be carried out without causing damage to the floating gate electrode.

H. In the semiconductor device of the invention, it is possible to include a silicide layer provided on the floating gate electrode.

According to the aspect, it is possible to provide for low resistance, restrain wiring delay and the like, and enhance operating properties of the nonvolatile memory.

I. In the semiconductor device of the invention, it is possible to provide a protective film on the clear area.

According to the aspect, when demarcating the clear area, the floating gate electrode is protected by the protective film, thus avoiding damage.

J. In the semiconductor device of the invention, a pattern of the protective area can have a large pattern by comparison to a pattern of the clear area.

According to the aspect, even if there is a mask discrepancy when forming the clear area, it is possible to provide the clear area above the protective area with certainty. As a result, it is possible to restrain from causing etching damage to the floating gate electrode, thus making it possible to provide the semiconductor device in which reliability is maintained.

K. In the semiconductor device of the invention, it is possible for the etching stopper film to be a nitride film.

L. In the semiconductor device of the invention, it is possible for the first interlayer insulating layer not to be provided above the nonvolatile memory.

BRIEF DESCRIPTION OF THE DRAWINGS

The invention will be described with reference to the accompanying drawings, wherein like numbers reference like elements.

DESCRIPTION OF THE EMBODIMENTS

Embodiments of the invention will be described below with reference to the drawings.

1. First, a nonvolatile memory (hereinafter may be referred to as the "memory cell" as well) 20 which is included in a semiconductor device according to the embodiment will be described while referring to FIGS. 1 and 2.

The memory cell 20 included in the semiconductor device of the embodiment is such that its control gate is an n-type impurity area inside a semiconductor layer 10, while its floating gate consists of a conductive layer of a one-layer polysilicon layer and the like (hereinafter referred to as the "nonvolatile memory device of one-layer type").

Figure 1:
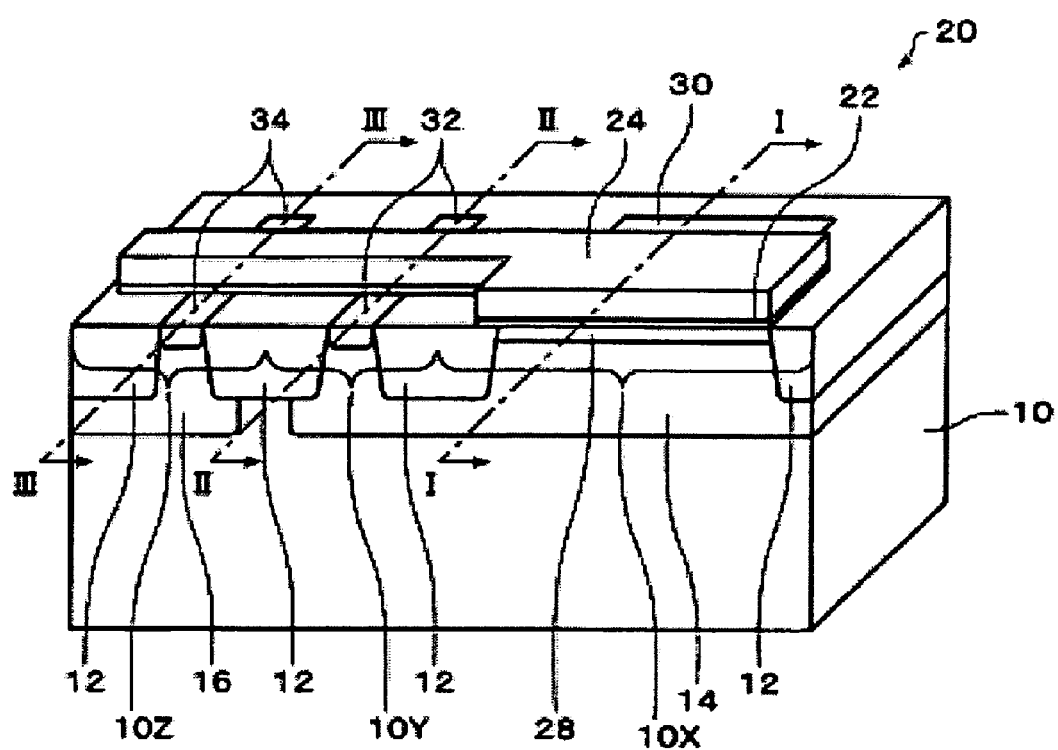
FIG. 1 is a perspective view schematically showing a memory cell included in a semiconductor device according to the embodiment.
Figure 2:
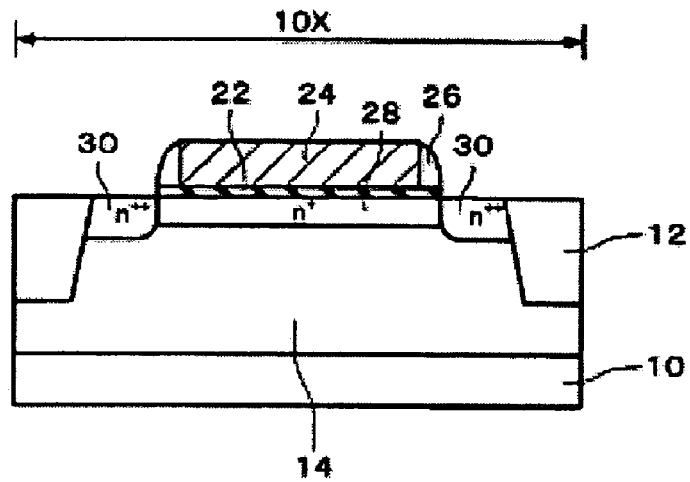
FIG. 2A is a sectional view along line I-I of FIG. 1.
FIG. 2B is a sectional view along line II-II.
FIG. 2C is a sectional view along line III-III.
Figure 2:
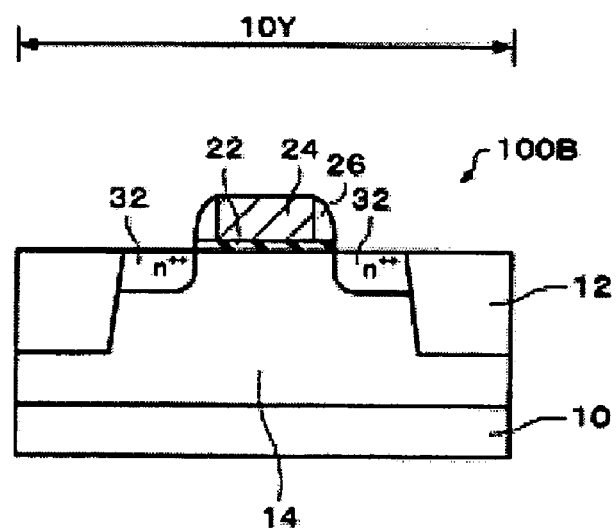
Figure 2:
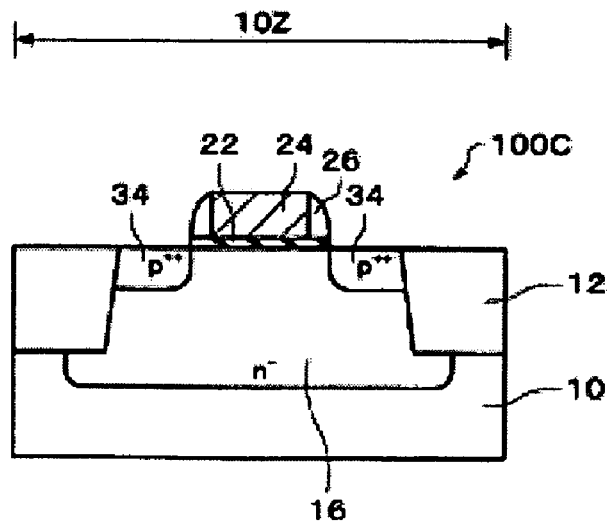

FIG. 1 is a perspective view showing the memory cell, FIG. 2A is a sectional view along line I-I of FIG. 1, FIG. 2B is a sectional view along line II-II of FIG. 1, and FIG. 2C is a sectional view along line III-III of FIG. 1.

As shown in FIG. 1, the memory cell 20 in the embodiment is provided on a p-type semiconductor layer 10. The semiconductor layer 10 is separated and demarcated by a separation insulating layer 12 into a first area 10X, a second area 10Y, and a third area 10Z.

The first area 10X and the second area 10Y are provided on a p-type well 14. The third area 10Z is provided on an n-type well 16. The first area 10X is a control gate part, the second area 10Y is a write part, and the third area 10Z is an erase part.

On the semiconductor layer 10 of the first area 10X to the third area 10Z, there is provided an insulating layer 22. On the insulating layer 22, there is set up a floating gate electrode 24 which is provided from the first area 10X to the third area 10Z.

Next, a sectional structure of each area will be described. As shown in FIG. 2A, on the first area 10X, there are the insulating layer 22 provided on the p-type well 14, a floating gate electrode 24 set up on the insulating layer 22, a sidewall 26 provided on a side face of the floating gate electrode 24, an n-type impurity area 28 provided on the semiconductor 10 under the floating gate electrode 24, and an n-type impurity area 30 set up adjacent to the impurity area 28.

The n-type impurity area 28 performs a role of a control gate, while the impurity area 30 is electrically connected to a control gate line and serves as a contact part for impressing a voltage on the control gate.

As shown in FIG. 2B, an n-channel MOS transistor 100B is set up on the second area 10Y to perform a write operation in the memory cell 20. The n-channel transistor 100B has the insulating layer 22 provided on the well 14, the floating gate electrode 24 provided on the insulating layer 22, the sidewall 26 provided on the side face of the floating gate electrode 24, and the impurity area 32 provided on the semiconductor layer 10. The impurity area 32 becomes a source area or a drain area.

As shown in FIG. 2C, on the third area 10Z is provided a p-channel transistor 100C. The p-channel transistor 100C includes the insulating layer 22 provided on the n-type well 16, the floating gate electrode 24 provided on the insulating layer 22, the sidewall 26 provided on the side face of the floating gate electrode 24, and the impurity area 34 provided on the n-type well 16. The impurity area 34 becomes the source area or the drain area.

Figure 3:
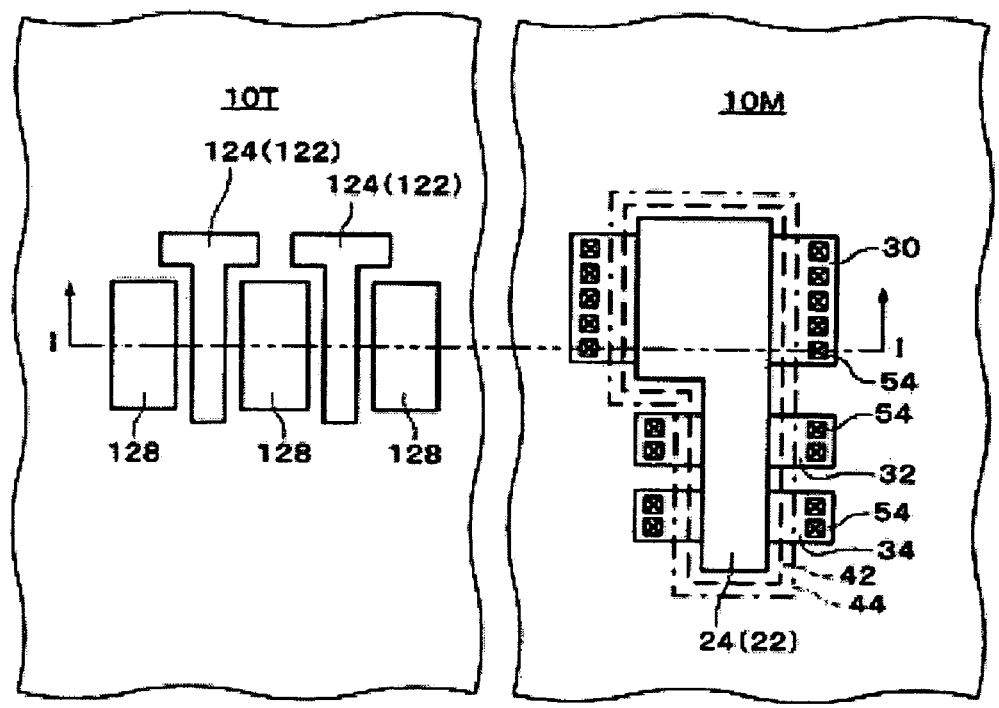
FIG. 3 is a plan view schematically showing a semiconductor device according to the embodiment.
Figure 4:
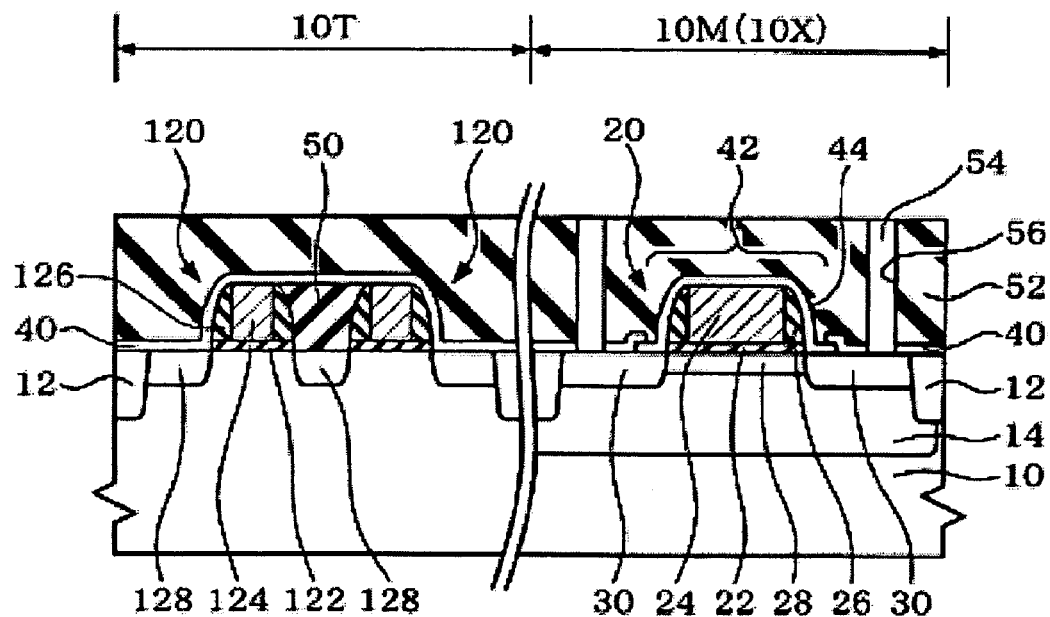
FIG. 4 is a sectional view along line I-I of FIG. 3.

Next, the semiconductor device according to the embodiment will be described while referring to FIGS. 3 and 4. FIG. 3 is a plan view schematically showing the semiconductor device according to the embodiment, and FIG. 4 is a sectional view along line I-I of FIG. 3.

It should be noted that in the plan view shown in FIG. 3, all constituent elements of the semiconductor device according to the embodiment are not shown. The plan view shows, on a memory area 10M, arrangements of the floating gate electrode 24, the impurity areas 30, 32, and 34, an clear area 42 (area devoid of an etching stopper film 40), and a protective film 44, and, on a transistor area 10T, arrangements of a gate electrode 124 and an impurity area 128.

As shown in FIG. 3, in the semiconductor device according to the embodiment, the memory area 10M and the transistor area 10T are provided. These areas are, as shown in FIG. 4, demarcated by the separation insulating layer 12 provided on the semiconductor layer 10. Namely, in the semiconductor device according to the embodiment, the memory cell 20 and the MOS transistors 120 to be used as a peripheral circuit are mixedly mounted on the same semiconductor layer 10.

First, the memory area 10M is described.

As shown in FIGS. 3 and 4, on the memory area 10M is provided the clear area 42 where the etching stopper film 40 is not provided. Further, in FIG. 3, a case where the clear area having a pattern overlaying the pattern of the floating gate electrode 24 is shown, but it is not limited to this.

So long as the clear area 42 is at least set up on the floating gate electrode 24, it is acceptable. Furthermore, it is preferable that the clear area 42 overlays a pattern of the entire surface of the floating gate electrode 24 with a pattern larger than the pattern.

Further, it is preferable for the clear area 42 to be such as to be larger in a range of not overlaying a contact layer 54 provided on the impurity areas 30, 32, and 34. Namely, it is preferable that the pattern of the clear area 42 is the largest pattern permissible in consideration of the element area so long as it is in the range of including the floating gate electrode 24 and not overlaying the contact layer 54.

Still further, in the semiconductor device shown in the embodiment, the contact layer 52 connected to the impurity areas 30, 32, and 34 was described as an example, but it is not limited to this.

Furthermore, it is preferable that an end of the clear area 42 is not provided on the side face of the sidewall 26. This is advantageous in a case where the sidewall 26 and the etching stopper film are formed of substantially the same material. In this case, should the end of the clear area 42 be arranged on the side face of the sidewall 26, even the sidewall 26 may be removed when removing the etching stopper film.

However, by arranging such that the end of the clear area 42 is not provided on the sidewall 26, it is possible to provide a semiconductor device having the sidewall 26 whose desired shape is maintained.

Moreover, the protective film 44 is provided on the clear area 42. It is preferable for the protective film 44 to be in a large pattern by comparison to the clear area 42. In FIGS. 3 and 4, there is shown a case where the protective pattern 44 having a fixed distance between the end of the clear area 42 and an end of the protective film 44 is provided.

On the protective film 44 and the etching stopper film 40 is provided the second interlayer insulating layer 52. As the second interlayer insulating layer 52, an oxide film, a PSG film, a BSG film, a BPSG film, a TEOS film, a USG film or a layered film of these can be cited. Of these, the BPSG film is particularly preferable.

In the second interlayer insulating layer 52 there is provided a contact layer 54 for connecting to the impurity area 30. The contact layer 54 is constituted by embedding a conductive material in a contact hole 56 provided in the second interlayer insulating layer 52. Further, the contact layer 54 for connecting to the impurity areas 32 and 34 are likewise provided in the second interlayer insulating layer 52 (refer to FIG. 3).

Next, the transistor area 10T will be described. On the transistor area 10T are provided a plurality of MOS transistors 120. In the embodiment, a case where two MOS transistors 120 are provided is illustrated. The MOS transistor 120 is constituted by including a gate insulating layer 120 provided on the semiconductor layer 10, a gate electrode 124 provided on the gate insulating layer 120, a sidewall 126 provided on the side face of the gate electrode 124, and an impurity area 128 which will become a source area or a drain area.

It should be noted that in the embodiment, the impurity area assumes a construction in which two MOS transistors 120 uses one common impurity area 128.

As shown in FIG. 4, between the two MOS transistors 120, the first interlayer insulating layer 50 is embedded. Specifically, "between the MOS transistors 120" means between the gate electrodes 124. On the first interlayer insulating layer 50, there are provided the etching stopper film 40 and the second interlayer insulating layer 52 in that order. This second interlayer insulating layer 52 is a layer extending to the second interlayer insulating layer 52 set up above the memory cell 20.

The first interlayer insulating layer 50, by comparison to the second interlayer insulating layer 52, is made up of an insulating layer whose material has a good embedding property. For example, it is preferable to use a material such as an Ozone TEOS film.

Advantages of the semiconductor device according to the embodiment will be described below.

(1) According to the semiconductor device of the embodiment, the MOS transistors 120 making up a memory cell 20 and a peripheral circuit are provided on the same semiconductor layer 10. The first interlayer insulating layer is provided between the MOS transistors 120, while no first interlayer insulating layer is provided above the nonvolatile memory.

On the transistor area 10T making up a peripheral circuit mixedly mounted with the memory cell 20, a space between the plurality of the MOS transistors 120 is small as compared to the memory area 10M, so that the embedding property required is different. Further, since the memory cell 20 according to the embodiment assumes a construction in which the floating gate electrode 24 is set up at the uppermost position, an insulating film provided above the floating gate electrode 24 may cause, for example, deterioration of properties such as the charge holding property.

Therefore, in the semiconductor device according to the embodiment, between the gate electrodes 124 of the MOS transistors 120 for which the high embedding property is required, the first interlayer insulating layer 50 meeting that requirement is provided. In other places, the second interlayer insulating layer 52 made up of a material not causing deterioration of the properties of the memory cell 20 is provided.

Consequently, it is possible to provide a semiconductor device which offers the embedding property as well as maintenance of the properties.

(2) Further, according to the semiconductor device of the embodiment, no etching stopper film 40 is provided on the floating gate electrode 24. In case of a microminiaturized semiconductor device, the etching stopper film 40 is a film necessary for preventing excessive etching when forming a contact hole. On the other hand, it may affect the properties of the memory cell 20.

Specifically, as the etching stopper film 40, a nitride film is often employed. But because the nitride film is a film in which charges tend to be supplemented, for example, the charge holding property of the memory cell 20 may be affected, as an electron injected into the floating gate film 24 is supplemented by the nitride film thus to erase data. This leads to vitiating the reliability of the semiconductor device.

However, in the semiconductor device of the embodiment, the clear area 42 is arranged on the floating gate electrode 24, hence, such problem can be restrained. Consequently, even in case of a semiconductor device subjected to microminiaturization, improvement of a retention property can be attained, so that it is possible to provide a semiconductor device of high reliability.

(3) Furthermore, in the semiconductor device of the embodiment, the protective film 44 is provided on the clear area 42. Hence, the floating gate electrode 24 is protected from etching at the time of forming the clear area 42, so that it is not subject damage. As a result, it is possible to provide a semiconductor device of improved reliability.

2. Manufacturing Method of the Semiconductor Device

Next, a manufacturing method of the semiconductor device according to the embodiment will be described while referring to FIGS. 5 to 9. FIGS. 5, 6 and 7B, 8, and 9 are sectional views schematically showing the manufacturing method of the semiconductor device according to the embodiment, indicating sectional views corresponding to FIG. 4. FIG. 7A is a plan view schematically showing the manufacturing method of the semiconductor device according to the embodiment, indicating a plan corresponding to FIG. 3.

Figure 5:
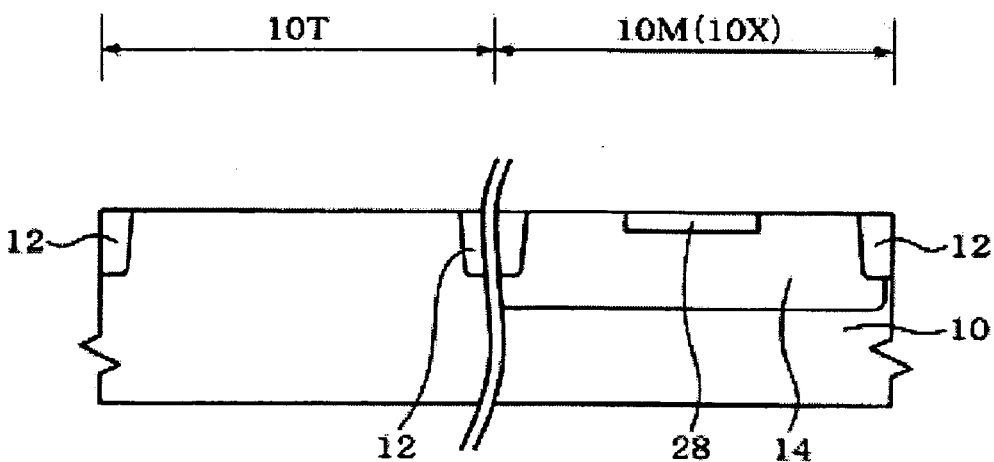
FIG. 5 is a sectional view schematically showing a manufacturing method of a semiconductor device according to the embodiment.

(1) First, as shown in FIG. 5, a separation insulating layer 12 is formed on the semiconductor layer 10. The separation insulating layer 12, can be formed by a method such as the LOCOS, the semi-recess LOCOS, and the STI.

It should be noted that the following description is based on a case of using a silicon substrate for the semiconductor 10. According to this, the memory area (equivalent to the "first area") 10M and the transistor area (equivalent to the "second area") 10T are demarcated. Further, in the memory area 10M, as shown in FIG. 1, the first area 10X, the second area 10Y and the third area 10Z are demarcated (the separation insulating layer 12 formed on the memory area 10M is equivalent to the "embedded insulation layer," the first area 10X is equivalent to the "third area," and the second area 10Y and the third area 10Z are equivalent to the "fourth area.")

In the embodiment, a case of forming according to the semi-recess LOCOS will be described as an example. In the semi-recess LOCOS, first, on the semiconductor layer 10, for example, an oxide, a nitride silicon layer and a nitride silicon layer (respectively not illustrated) are formed in that order by the CVD.

Next, on the nitride silicon layer, a mask layer (not illustrated) having an opening in an area forming the separation insulating layer 12 is formed. Then, a groove (not illustrated) is formed in the semiconductor layer 10 by etching the nitride silicon layer, the oxide nitride silicon layer and the semiconductor layer 10.

This is followed by removing the mask layer and selective thermal oxidation is carried out using the nitride silicon layer as a mask, thereby forming the separation insulating layer 12. Further, after carrying out the thermal oxidation, a position of a surface of the separation insulating layer 12 becomes higher than a height of the surface of the semiconductor layer 10.

But, as necessary, the upper surface of the separation insulating layer 12 may be subjected to etching to make the upper surface of the separation insulating layer 12 approximately as high as the upper surface of the semiconductor layer 10. It should be noted that in FIG. 5, for the sake of convenience, there is shown a case of forming the separation insulating layer 12 having the same height as the surface of the semiconductor layer 10.

Next, well formation is carried out. In well formation, p-type wells 14 are formed in the first area 10X and the second area 10Y, and the n-type well 16 is formed in the third area 10Z. Formation of the p-type well 14 is carried out by introducing a p-type impurity after forming a mask layer (not illustrated) covering what is other than the first area 10X and the second area 10Y. Then, formation of the n-type well 16 is carried out by introducing an n-type impurity after forming a mask layer (not illustrated) covering what is other than the third area 10Z.

In this formation process of wells 14 and 16, as necessary, heat treatment may be conducted to diffuse impurities. Further, since order of forming the well 14 and the well 16 does not matter, either may be formed first. Furthermore, in this process, even in the transistor area 10T, too, as necessary, well formation (not illustrated) can be carried out.

Next, on the memory area 10M, formation of the impurity area 28 which is to become a control gate is carried out. The control gate is formed by forming a mask layer (not illustrated) covering what is other than an area, in which the floating gate electrode 24 is arranged, and introducing an n-type impurity into the semiconductor layer.

Figure 6:
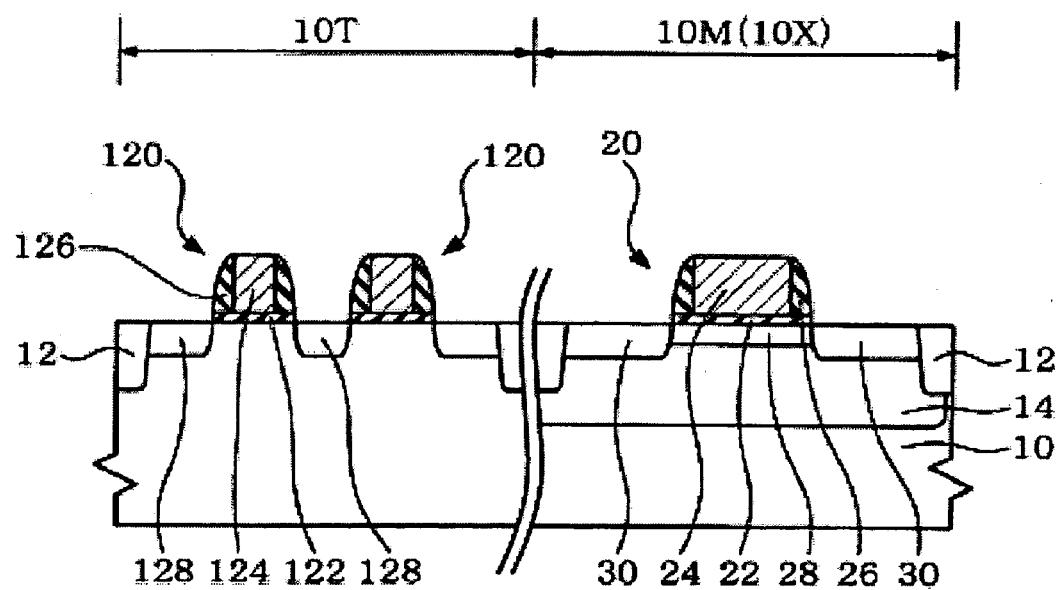
FIG. 6 is a sectional view schematically showing a manufacturing method of a semiconductor device according to the embodiment.
Figure 7:
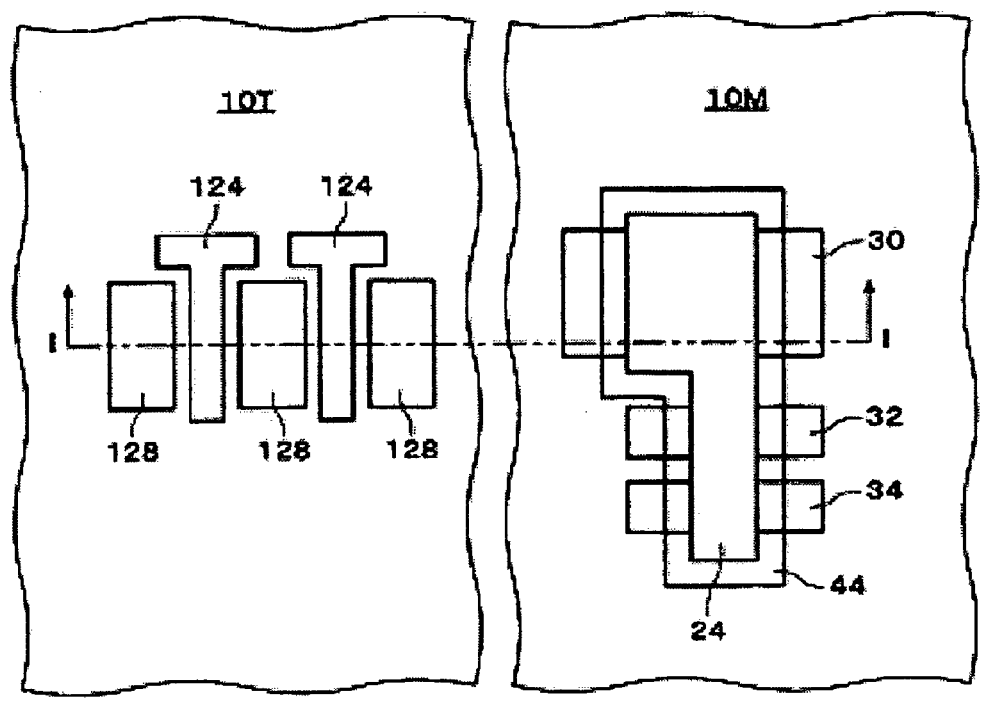
FIG. 7 is a sectional view schematically showing a manufacturing method of a semiconductor device according to the embodiment.
Figure 7:
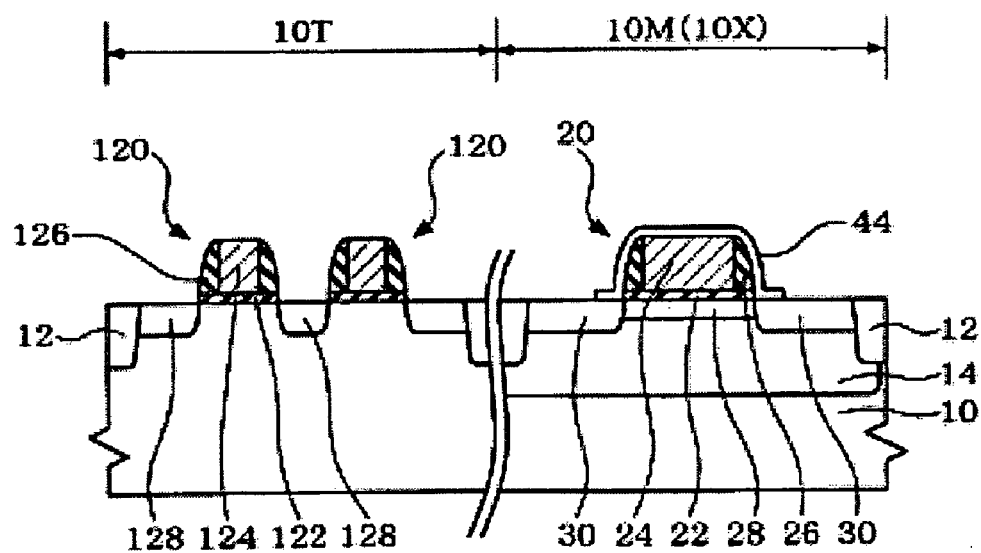

(2) Next, as shown in FIG. 6, on the memory area 10M, an insulating layer 22 is formed on the semiconductor layer 10 of the first area 10X, the second area 10Y, and the third area 10Z. The insulating layer 22 can be, for example, formed by thermal oxidation. On the other hand, on the transistor area 10T, a gate insulating layer 122 of the MOS transistor 120 is formed by the same process.

Then, as shown in FIG. 6, on the memory area 10M, the floating gate electrode 24 is formed on the insulating layer 22. The floating gate electrode 24 is formed by forming, for example, a conductive layer (not illustrated) made up of a polysilicon layer above the semiconductor layer 10 and subjecting this conductive layer to patterning.

On the other hand, on the transistor area 10T, the gate electrode 124 of the MOS transistor 120 is formed by the same process. Subsequently, sidewalls 26 and 126 are respectively formed on the side faces of the floating gate electrode 24 and the gate electrode 124. Formation of the sidewalls 26 and 126 is carried out by forming an insulating layer (not illustrated) above the semiconductor layer 10 and subjecting this insulating layer to anisotropic etching.

Next, on the memory area 10M, impurity areas 30, 32, and 34 are formed on the semiconductor layer 10, while on the transistor area 10T, the impurity area 128 which is to become a source area or a drain area is formed. In forming these impurity areas, a process of introducing the same conductive type impurity can be carried out by the same process.

(3) Next, in a process to be explained later, there is formed the protective film 44 which is to be provided on a clear area to be formed on the memory area 10M (refer to FIG. 7A and B) in the later process. The protective film 44 is formed by first forming an insulating layer (not illustrated) such as a publicly known oxide silicon layer over the entire surface of the memory area 10A and the transistor area 10T, and subjecting this insulating layer to patterning.

At this time, as shown in FIG. 7B, the insulating layer is subjected to patterning as if covering above the floating gate electrode 24. At this point, the protective film, though not illustrated, can perform a role as a protection film (a film to protect from silicide formation) when forming silicide such as a semiconductor element and a resistance which are mixedly mounted on the same semiconductor layer 10. According to the embodiment, by using the protection film at the time of forming the silicide layer as the protective film 44, an increase in the number of processes can be prevented.

Figure 8:
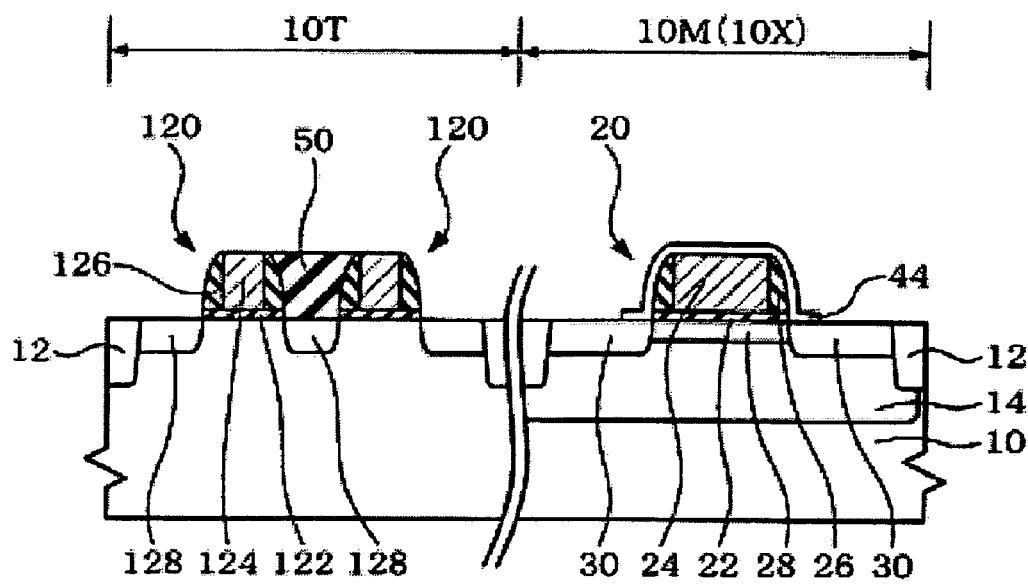
FIG. 8 is a sectional view schematically showing a manufacturing method of a semiconductor device according to the embodiment.

(4) Next, as shown in FIG. 8, on the transistor area 10T, the first interlayer insulating layer 50 is formed between the gate electrodes 124 of the MOS transistors 120. As the first interlayer insulating layer 50, various publicly known insulating layers can be formed. Above all, it is preferable to form an ozone TEOS film.

The first interlayer insulating layer 50 can be formed between the gate electrodes 124, after forming an insulating layer (not illustrated) above the semiconductor layer 10 of the transistor area 10T and the memory area 10M, by etching it back until the upper surface of the gate electrodes 124 is exposed.

It should be noted that on the memory area 10M, because of a wide space, in the etch back process, the insulating layer formed other than that above the floating gate electrode 24 will be nearly completely removed. Further, in the embodiment, an example of carrying out formation of the protective film 44 first was described, but it is not limited to this. For example, formation of the first interlayer insulating layer 50 is carried out first, then, the protective film 44 may be formed.

Figure 9:
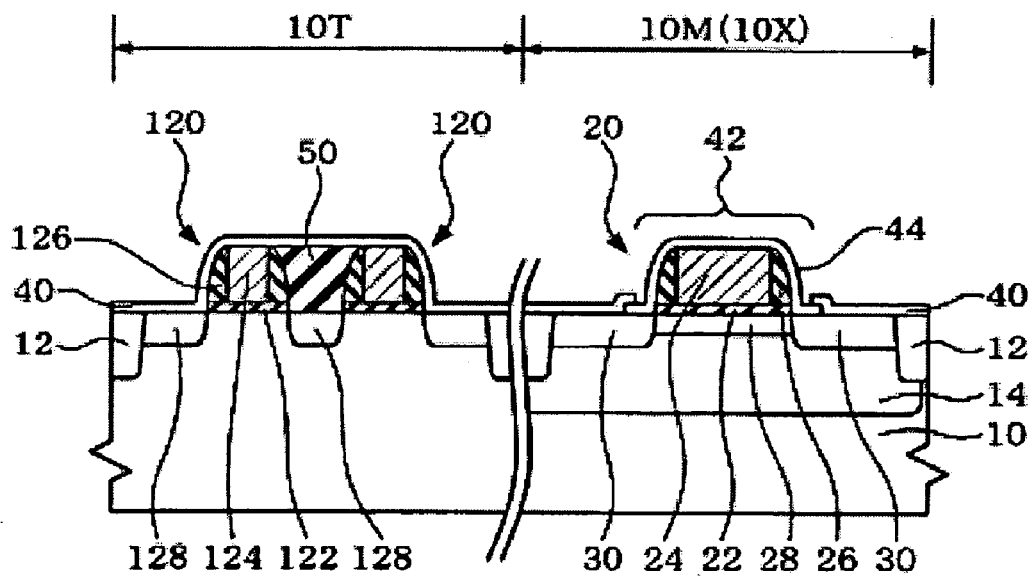
FIG. 9 is a sectional view schematically showing a manufacturing method of a semiconductor device according to the embodiment.

(5) Next, as shown in FIG. 9, the etching stopper film 40 is formed on the memory cell 20 and the MOS transistors 120. As the etching stopper film 40, as compared to the interlayer insulating layer 50 to be formed in the later process, a material of a small etching rate is used. For example, if the interlayer insulating layer 50 is an oxide silicon layer, a nitride silicon film can be used as the etching stopper film 40.

Then, the clear area 42 is formed. Formation of the clear area 42 is carried out by forming a mask layer of a preset pattern above the etching stopper film 40 and removing the etching stopper film 40 through use of this mask layer. The clear area 42 has a pattern overlaying the upper surface of the floating gate electrode 24 and is formed in a manner of having a pattern also overlaying the protective film 44. In this process, the protective film 44 performs a role of preventing etching damage when forming the clear area 42 from extending to the floating gate electrode 24.

(6) Next, the second interlayer insulating layer 52 is formed (refer to FIG. 4) above the memory cell 20 and the MOS transistor 120. As the second interlayer insulating layer 52, an oxide film, a PSG film, a BSG film, a BPSG film, a USG film or a layered film of these can be used. Of these, the BPSG film is particularly preferable.

Next, a contact layer 54 is formed on the second interlayer insulating layer 52. Formation of the contact layer 54 is carried out by forming the contact hole 56 in the interlayer insulating layer 50 through publicly known lithography and etching techniques and embedding a conductive layer in this contact hole 56.

The semiconductor device according to the embodiment can be manufactured by means of the above-referenced process.

Variation Example

Next, a variation example of the semiconductor device according to the embodiment will be described while referring to FIG. 10. The variation example differs from the embodiment in that a silicide layer 38 is provided on the floating gate electrode 24 and the impurity areas 30, 32, and 34 and the gate electrode 124 as well as the impurity area 128. In regard to a construction common to the semiconductor device according to the embodiment, its detailed description is omitted.

As shown in FIG. 3, in the same way as the semiconductor device according to the embodiment, there are set up the protective film 44 and the clear area 42 on the floating gate electrode 24 in the semiconductor device according to the variation example. While referring to FIG. 10, its sectional structure will be described.

Figure 10:
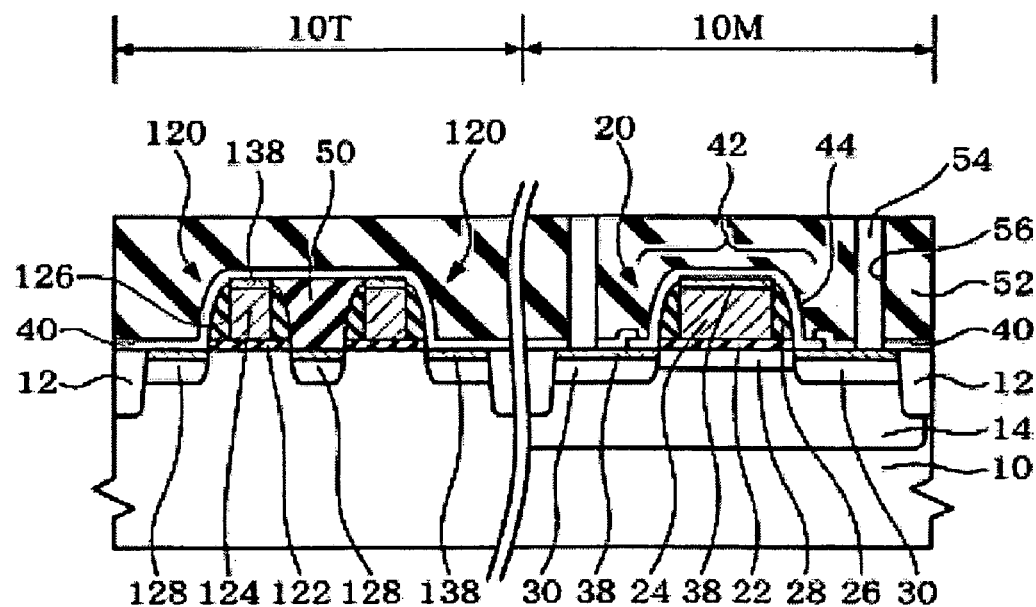
FIG. 10 is a sectional view schematically showing a manufacturing method of a semiconductor device according to the variation example.

As shown in FIG. 10, it is constituted by the separation insulation layer 12 provided on the semiconductor layer 10, the insulating layer 22 provided on the semiconductor layer 10, the floating gate electrode 24 provided on the insulating layer 22, the sidewall 26 provided on the side face of the floating gate electrode 24, and the impurity area 28 provided on the semiconductor layer 10.

The silicide layer 38 is set up on the floating gate electrode 24. On the silicide layer 38 is set up the protective film 44, while the clear area 42 is arranged on the protective film 44. Patterns of the clear area 42 and the protective film 44 are the same as the embodiment.

Further, on the transistor area 10T, a silicide layer 138 is provided on the gate electrode 124 and the impurity area 128.

According to the semiconductor device based on the variation example, provision of the silicide layers 38 and 128 makes it possible to produce low resistance in the floating gate electrode 24, the gate electrode 124 and various impurity areas 30, 32, 34, and 108, and to improve wiring delays and the like, thus providing a semiconductor device of fast operating speed.

Next, a manufacturing method of the semiconductor device according to the variation example will be described while referring to FIG. 10. Note that in the following description, details of the processes common to the manufacturing method of the semiconductor device according to the embodiment are omitted.

First, processes (1) and (2) of the embodiment are carried out in the same way as the embodiment. Subsequently, as shown in FIG. 10, formation of the silicide layers 38 and 128 is carried out. The formation of the silicide layers is performed by, for example, causing a reaction to produce silicide through application of heat treatment after forming a metallic layer, then removing an non-reacted metallic layer.

For the metallic layer, cobalt, titanium, vanadium, chromium, manganese, iron, nickel, zirconium, niobium, molybdenum, ruthenium, hafnium, tantalum, tungsten, iridium, platinum or an alloy layer of these may be cited. After forming the silicide layers 38 and 128, the protective film 44 of the preset pattern is formed. Thereafter, processes (3) to (6) of the embodiment are performed, and, as shown in FIG. 10, formation of the first interlayer insulating layer 50, formation of the etching stopper film 40, demarcation of the clear area 42, and formations of the second interlayer insulating layer 52 and the contact layer 534 are carried out. Through the processes, the semiconductor device according to the variation example can be manufactured.

It should be noted that the invention is not limited to the above-referenced embodiments and may be modified, as necessary, within the scope of a gist of the invention. For example, in the embodiment, as an example of the nonvolatile memory of one layer type, there was a description in which the MOS transistors performing write and read operations are different from the MOS transistors performing an erase operation. However, it is not limited to this, and so there may be employed another construction in which the same MOS transistors perform write, read and erase operations.

Further, in the embodiment, there was a description of the construction in which on the first area 10X, the impurity area 28 provided below the floating gate electrode 24 performs the role of a control gate. But it is not limited to this. For example, there may be used a construction in which an n-type well is provided on the first area 10X such as to employ this n-type well as the control gate.

Furthermore, in the embodiment, there was shown a case where a bulk-shape semiconductor layer was used, while it is not limited to this, so that it may very well be a semiconductor layer (SOI: Silicon on Insulator) provided on the insulating matter.

What is claimed is:

1. A semiconductor device comprising:
   a nonvolatile memory;
   a first transistor;
   a second transistor;
   a first interlayer insulating layer provided between the first transistor and the second transistor;
   a first insulating film being a continuous layer continuously provided above a floating gate electrode, sidewalls, a first part of a first impurity region and a second part of the second impurity region of the nonvolatile memory;
   a second insulating film provided above the first transistor, the second transistor, the first interlayer insulating layer, a third part of the first insulating film and a fourth part of the first insulating film, the second insulating film being not provided at least on the floating gate electrode; and
   a second interlayer insulating layer provided above the first insulating film and the second insulating film;
   wherein both the first insulating film and the second insulating film are provided above the first impurity region and the second impurity region, the first insulating film and the second insulating film overlap only above the first impurity region and the second impurity region, and the second insulating film terminates on the first insulating film.

2. The device according to claim 1, the first insulating film including a first silicon oxide.

3. The device according to claim 1, the second insulating film including a silicon nitride; and the second interlayer insulating layer including a second silicon oxide.

4. The device according to claim 1, the second insulating film being not provided on the sidewalls.

5. The device according to claim 1,
   the second interlayer insulating layer including at least one conductive film, the at least one conductive film being electrically connected to the first impurity region or the second impurity region through the second insulating film.

6. The device according to claim 1, the first interlayer insulating layer being an ozone TEOS film; and the second interlayer insulating layer being a BPSG film.

7. The device according to claim 1,
   a first height of a first gate electrode of the first transistor, a second height of a second gate electrode of the second transistor and a third height of the first interlayer insulating layer being approximately same.

8. The device according to claim 1,
   the first insulating film including a first silicon oxide;
   the second insulating film including a silicon nitride;
   the first interlayer insulating layer being an ozone TEOS film; and
   the second interlayer insulating layer being a BPSG film.

9. The device according to claim 8,
   the second interlayer insulating layer including at least one conductive film, the at least one conductive film being electrically connected to the first impurity region or the second impurity region through the second insulating film.

10. The device according to claim 1,
    a semiconductor layer including the first impurity region, a first silicide layer provided on the first impurity region, the second impurity region and a second suicide layer provided on the second impurity region;
    the floating gate electrode provided above the semiconductor layer, the floating gate electrode being disposed above between the first impurity region and the second impurity region;
    the first insulating film provided on the gate electrode directly; and
    the second insulating film provided on the first suicide layer and the second silicide layer directly, the second insulating film being different from the first insulating film.

* * * * *